(12) United States Patent
Li et al.

(10) Patent No.: US 8,508,294 B2
(45) Date of Patent: Aug. 13, 2013

(54) POWER AMPLIFIER WITH FEEDBACK IMPEDANCE FOR STABLE OUTPUT

(75) Inventors: Kan Li, Singapore (SG); Poh Boon Leong, Singapore (SG); Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 12/983,731

(22) Filed: Jan. 3, 2011

(65) Prior Publication Data
US 2011/0163804 A1  Jul. 7, 2011

Related U.S. Application Data

(60) Provisional application No. 61/292,124, filed on Jan. 4, 2010.

(51) Int. Cl.
*H03F 1/36* (2006.01)

(52) U.S. Cl.
USPC .............................. 330/107; 330/109; 330/294

(58) Field of Classification Search
USPC ............................ 330/107, 109, 294, 86, 282
See application file for complete search history.

(56) References Cited

U.S. PATENT DOCUMENTS

| | | | |
|---|---|---|---|
| 4,417,216 A | 11/1983 | Davis | |
| 6,859,097 B2 * | 2/2005 | Chandler | 330/107 |
| 2002/0153946 A1 | 10/2002 | Nguyen | |
| 2009/0096533 A1 | 4/2009 | Paul | |

FOREIGN PATENT DOCUMENTS

| | | |
|---|---|---|
| GB | 2200007 A | 7/1988 |
| WO | 0189081 A2 | 11/2001 |

OTHER PUBLICATIONS

PCT International Search Report, Application No. PCT/IB2011/000171, Jun. 29, 2011.

* cited by examiner

*Primary Examiner* — Hieu Nguyen

(57) ABSTRACT

In one embodiment, an apparatus includes an amplifier circuit having a phase shift. The amplifier circuit amplifies a signal for wireless transmission. A feedback circuit is coupled to the amplifier circuit and includes a capacitor. An input impedance to the amplifier circuit has a same impedance characteristic as a feedback circuit impedance of the feedback circuit. A total phase shift of the signal for the amplifier circuit and the feedback circuit is less than a threshold.

20 Claims, 8 Drawing Sheets

US 8,508,294 B2

POWER AMPLIFIER WITH FEEDBACK IMPEDANCE FOR STABLE OUTPUT

CROSS REFERENCE TO RELATED APPLICATIONS

The present disclosure claims priority to U.S. Provisional App. No. 61/292,124 for "PA Close-Loop Stability Analysis and Solution" filed Jan. 4, 2010, which is incorporated herein by reference in its entirety for all purposes.

BACKGROUND

Particular embodiments generally relate to power amplifiers.

Unless otherwise indicated herein, the approaches described in this section are not prior art to the claims in this application and are not admitted to be prior art by inclusion in this section.

FIG. 1 depicts an example of a power amplifier (PA) 100. Power amplifier (PA) 100 is coupled to a wideband transformer 101 that includes a transformer 102 and a load 104. Power amplifier 100 may be part of a wireless transmitter. In one example, a signal from power amplifier 100 is coupled through transformer 102 and transmitted through an antenna.

Power amplifier 100 includes a first amplifier 108a, an inductor-capacitor (LC) resonant tank 110, a second amplifier 108b, and a resistor R1 in a feedback loop. Power amplifier 100 may become unstable. An input circuit 106 provides an input signal to power amplifier 100.

A dominant pole is introduced by amplifier 108a and LC resonant tank 110. This introduces a phase shift of around 90° (at a unity gain point) at for the signal output by power amplifier 100. Also, a phase shift introduced by amplifier 108b and transformer 102 may be less, such as 30°. To have a stable power amplifier, a total phase shift for power amplifier 100 should be less than 180°. Thus, a phase shift introduced by the feedback loop should be less than 60°.

The input impedance is shown as impedance Z_input and in this case, is a parasitic capacitance of a transistor in amplifier 108a. The parasitic capacitance is modeled as a parasitic capacitor Cp. Because the feedback impedance Z_feedback is a resistance, the resistor-capacitor combination may introduce a phase shift that is greater than 60°. This may cause power amplifier 100 to be unstable and the signal may oscillate. Also, the resistor-capacitor combination may create a pole that is within the working bandwidth of the wireless transmitter. This may alter the gain characteristics for power amplifier 100.

SUMMARY

In one embodiment, an apparatus includes an amplifier circuit having a phase shift. The amplifier circuit amplifies a signal for wireless transmission. A feedback circuit is coupled to the amplifier circuit and includes a capacitor. An input impedance to the amplifier circuit has a same impedance characteristic as a feedback circuit impedance of the feedback circuit. A total phase shift of the signal for the amplifier circuit and the feedback circuit is less than a threshold.

In one embodiment, the phase shift for the amplifier circuit comprises a first phase shift and a second phase shift. The amplifier circuit includes a first amplifier stage associated with the first phase shift and a second amplifier stage associated with the second phase shift. The total phase shift of the signal for the first amplifier stage, the second amplifier stage, and the feedback circuit is less than the threshold.

In one embodiment, the apparatus includes a resonant tank circuit and a transformer. The first amplifier stage and the resonant tank circuit introduce the first phase shift and the second amplifier stage and the transformer introduce the second phase shift.

In another embodiment, a system includes a first amplifier stage configured to amplify a signal for wireless transmission. A resonant tank circuit receives the signal from the first amplifier stage. The first amplifier stage and the resonant tank circuit introduce a first phase shift in the signal. A second amplifier stage amplifies the signal from the resonant tank circuit. A transformer receives the signal from the second amplifier stage. The second amplifier stage and the transformer introduce a second phase shift in the signal. A feedback circuit is coupled to the second amplifier stage and includes a capacitor. An input impedance to the first amplifier circuit has a same impedance characteristic as a feedback circuit impedance of the feedback circuit. A total phase shift of the signal transferred through a feedback loop is less than a threshold, the feedback loop including the first amplifier stage, resonant tank circuit, second amplifier stage, and the feedback circuit.

In one embodiment, a method includes amplifying a signal for wireless transmission through an amplifier circuit and coupling the signal through a feedback circuit coupled to the amplifier circuit. The feedback circuit includes a capacitor, wherein an input impedance to the amplifier circuit has a same impedance characteristic as a feedback circuit impedance of the feedback circuit. A total phase shift of the signal for the amplifier circuit and the feedback circuit is less than a threshold.

In one embodiment, the amplifier circuit includes a first amplifier stage and a second amplifier stage. The method further includes coupling the signal through the first amplifier stage; coupling the signal through a resonant tank circuit; coupling the signal through the second amplifier stage; and coupling the signal through a transformer.

The following detailed description and accompanying drawings provide a more detailed understanding of the nature and advantages of the present invention.

DETAILED DESCRIPTION

Described herein are techniques for a power amplifier. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 1:
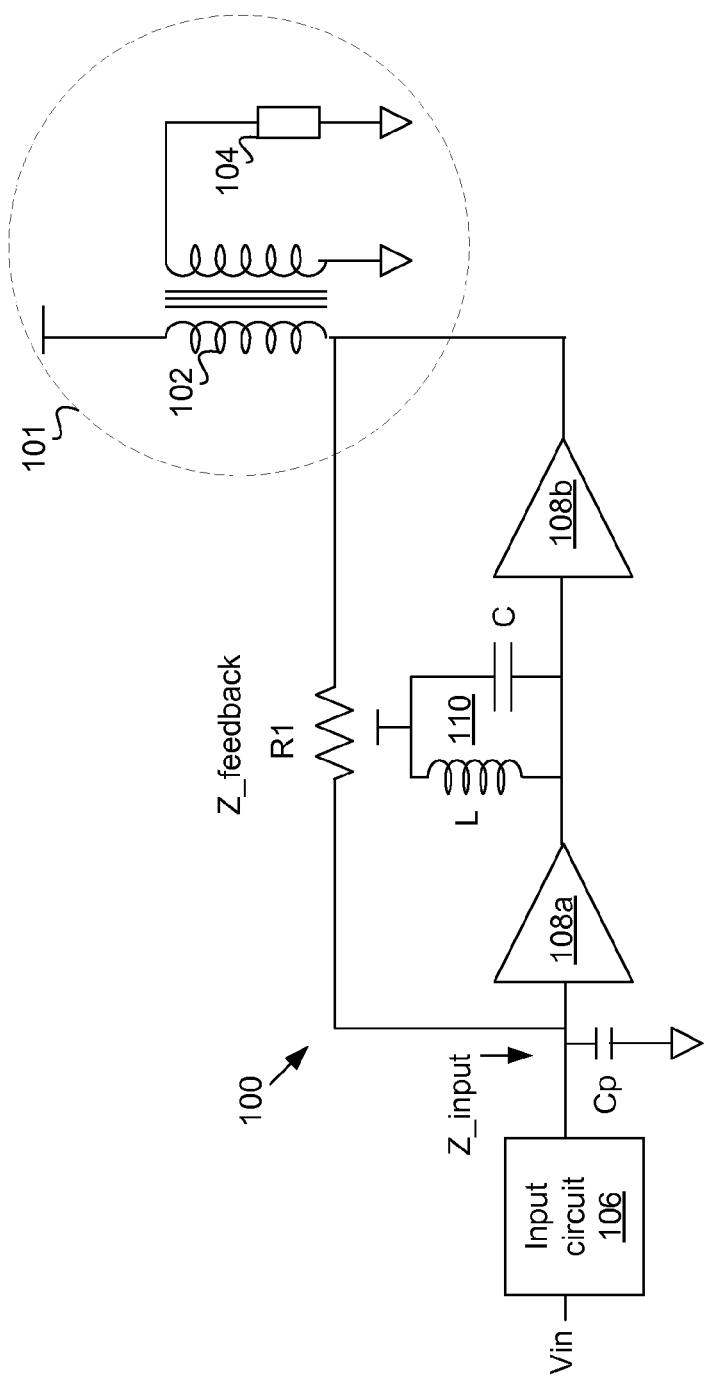
FIG. 1 depicts an example of a power amplifier (PA).
Figure 2A:
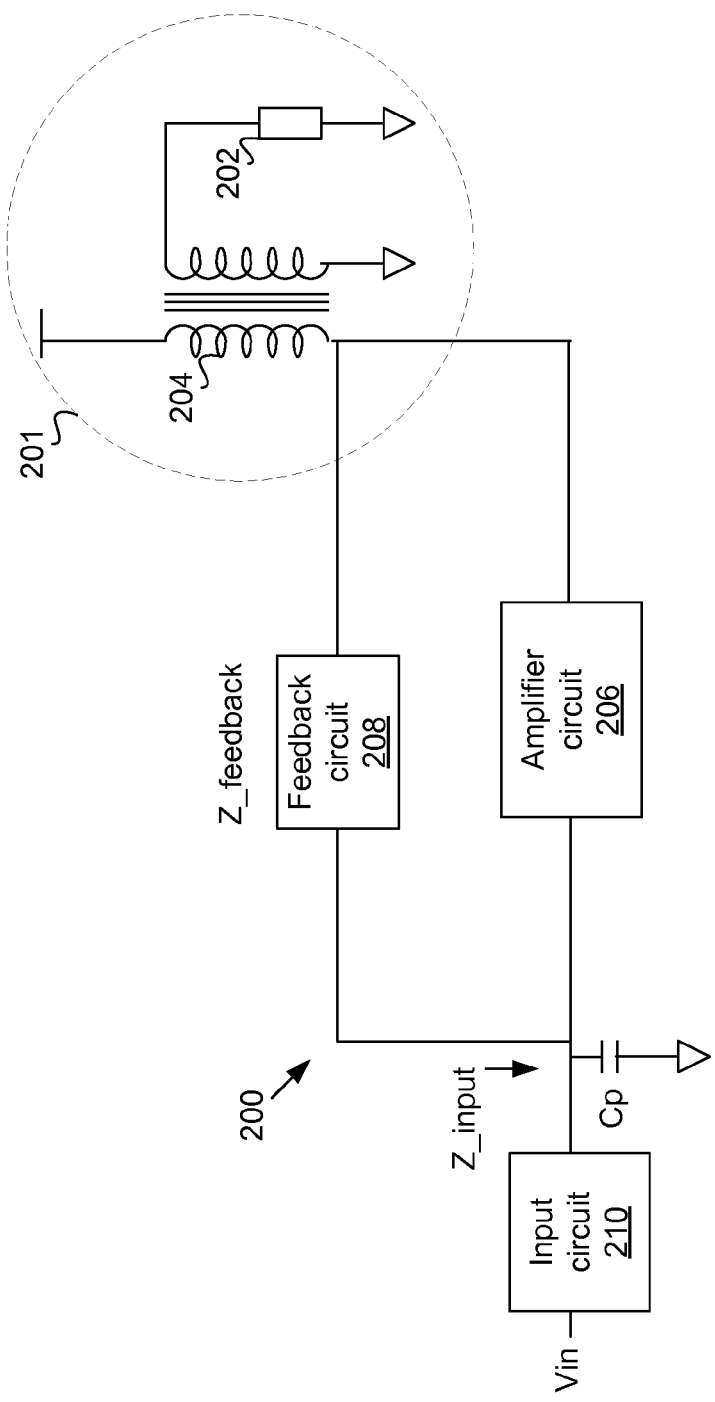
FIG. 2a depicts an example of a power amplifier according to one embodiment.

FIG. 2a depicts an example of a power amplifier (PA) 200 according to one embodiment. Power amplifier 200 drives an antenna (not shown) through a wideband transformer 201, which includes a transformer 204 and a load 202. For example, power amplifier 200 amplifies a signal from an input circuit 210 for wireless transmission through a wideband wireless transmitter. However, power amplifier 200 may be part of other systems.

Power amplifier 200 includes an amplifier circuit 206 and a feedback circuit 208. A feedback loop is from an output of amplifier circuit 206, through feedback circuit 208, and into an input of amplifier circuit 206. The total phase shift of the feedback loop should be less than a threshold, such as 180°. The threshold may be determined where a phase shift above the threshold may cause power amplifier 200 to become unstable. For example, the output of power amplifier 200 may oscillate if the phase shift is greater than 180°. Also, feedback circuit 208 should not create a pole within a bandwidth range, such as the working bandwidth of the transmitter. A pole within the working bandwidth might change the gain characteristics of power amplifier 200.

A feedback factor β is analyzed to determine if a pole is created or an undesirable amount of phase shift is caused. The feedback factor β is defined as:

$$\beta = \frac{Z\_input}{Z\_input + Z\_feedback},$$

where Z_input is the input impedance looking into an input node between amplifier circuit 206 and input circuit 210 and Z_feedback is the feedback impedance of feedback circuit 208. As will be described in more detail below, in particular embodiments, the impedance Z_feedback has the same impedance characteristic as the impedance Z_input. For example, the impedance Z_feedback is equivalent to a capacitance and the impedance Z_input is equivalent to a capacitance. By having the same impedance characteristic, a pole may not be created by the feedback loop. Also, the phase shift caused by the feedback loop is less than the threshold in which power amplifier 100 may become unstable. For example, the phase shift (or no phase shift) caused by feedback circuit 208 when combined with the phase shift of amplifier circuit 206 is less than a threshold of, e.g., 180 degrees.

Figure 2B:
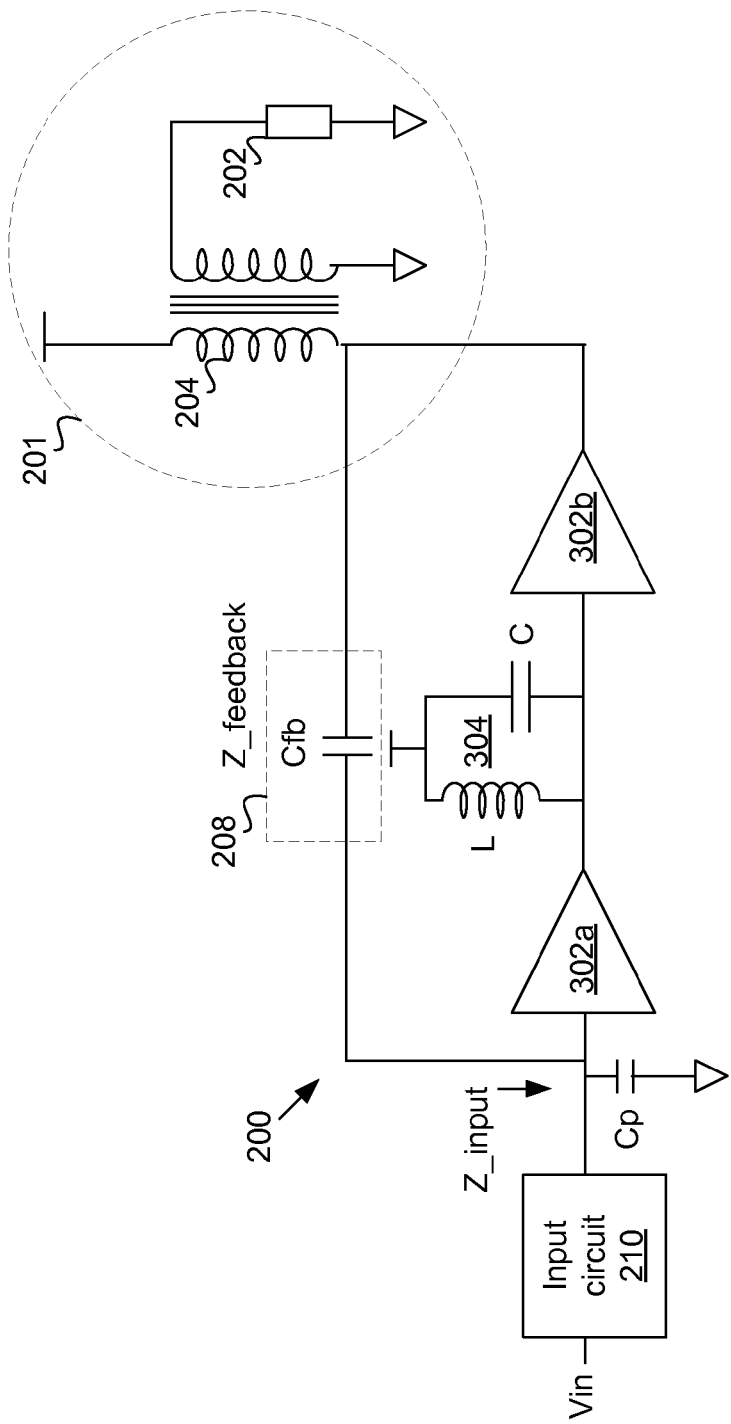
FIG. 2b depicts a more detailed example of the power amplifier according to one embodiment.

FIG. 2b depicts a more detailed example of power amplifier 200 according to one embodiment. Amplifier circuit 206 includes a first amplifier 302a, a resonant tank circuit 304 and a second amplifier 302b. Resonant tank 304 includes an inductor L1 and a capacitor C1. Other examples of resonant tanks may also be used. Transformer 204 and load 202 are also included in wideband transformer 201. Feedback circuit 208 includes a capacitor Cfb. A parasitic capacitance of first amplifier 302a is modeled by a capacitor Cp.

First amplifier 302a and resonant tank circuit 304 may have a high quality factor (Q). For example, the quality factor may be greater than 10. Second amplifier 302b and transformer 204 may have a low quality factor. For example, the quality factor of amplifier 302b and transformer 204 is lower than the quality factor of amplifier 302a and resonant tank circuit 304. The lower Q of amplifier 302b and transformer 204 allows power amplifier 200 to have a higher loop gain while the loop is still stable. Also, the higher the Q of amplifier 302a means the higher loop gain can be achieved while still having the loop be stable. Also, in one embodiment, it is desirable to have a low impedance coupled to transformer 204 and the antenna. Amplifier 302b provides the low impedance in part because of the low quality factor.

Amplifier 302a and resonant tank circuit 304 provide a dominant pole in the frequency response of power amplifier 200. Amplifier 302b and transformer 204 provide another pole that is less dominant. When described herein, amplifier 302a may be described as introducing the dominant pole and amplifier 302b as introducing another pole. It will be understood that the poles may be introduced by a combination of amplifier 302a with resonant tank circuit 304 or amplifier 302b with an inductor of transformer 204. Other combinations may also be used to amplify the signal.

Amplifier 302a also introduces a larger phase shift than introduced by amplifier 302b. For example, the phase shift of amplifier 302a may be around 90°. The second pole introduced by amplifier 302b may not be dominant. Due to a frequency response that is not as sharp, the phase shift introduced by amplifier 302b may be around 30°.

In one embodiment, the total phase shift of power amplifier 200 should be less than a threshold to have a stable amplifier with the gain desired. For example, a total phase shift may be less than 180°. Thus, the feedback circuit should cause less than a 60° phase shift if the phase shift for amplifier 302a is 90° and the phase shift for amplifier 302b is 30°.

The phase shift of feedback circuit 208 may be determined based on the feedback factor, β. The feedback factor β may be as follows:

$$\beta = \frac{\frac{1}{j\omega * Cp}}{\frac{1}{j\omega * Cp} + \frac{1}{j\omega * Cfb}} = \frac{Cfb}{Cfb + Cp}.$$

The feedback factor does not cause any phase shift in the signal. This is because the impedances Z_feedback and Z_input have the same impedance characteristics, and a resistor-capacitor circuit is not being introduced in feedback circuit 208. Rather, the impedance characteristic of feedback circuit 208 is capacitor Cfb and the impedance characteristic of Z_input is capacitor Cp. This does not introduce a pole and a phase shift by the feedback factor.

The closed loop gain may be different based on input circuit 210. The following will describe different input circuits 210.

Figure 3A:
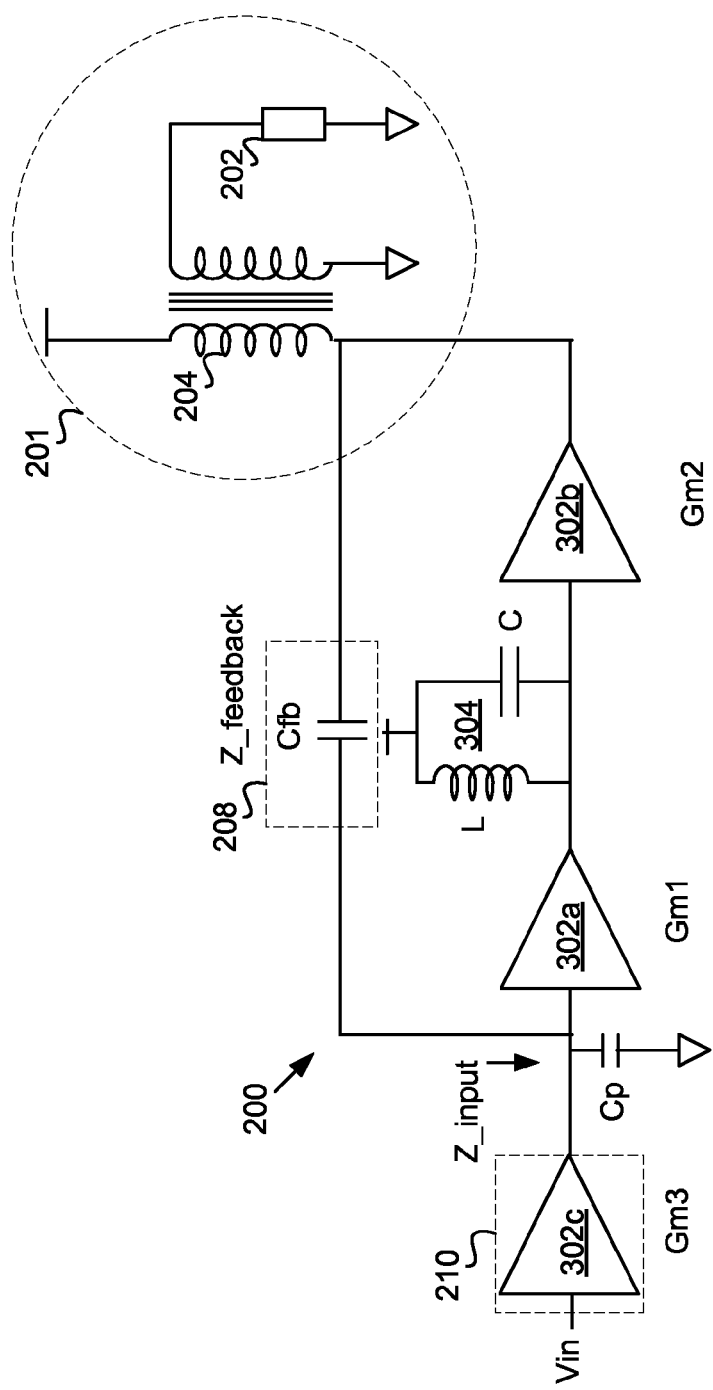
FIG. 3a depicts an example of a power amplifier with a current input driver according to one embodiment.

FIG. 3a depicts an example of power amplifier 200 with a current input driver according to one embodiment. Input circuit 210 includes a third amplifier 302c. In one embodiment, a third amplifier 302c includes a transductance of Gm3. First amplifier 302a includes a transductance of Gm1 and second amplifier 302b includes a transductance of Gm2. Amplifiers 302a-302c may be transductance amplifiers (Gm amplifiers) that output a current proportional to the input voltage. The loop gain of power amplifier 200 is:

Loop_Gain=$A(j\omega)*\beta$.

The feedback factor is:

$$\beta = \frac{Cfb}{Cfb + Cp}.$$

As discussed above, the feedback factor β does not introduce a phase shift or pole. The closed loop gain may be as follows:

$$ClosedLoopGain = \frac{Gm3}{j\omega * Cfb}.$$

Figure 3B:
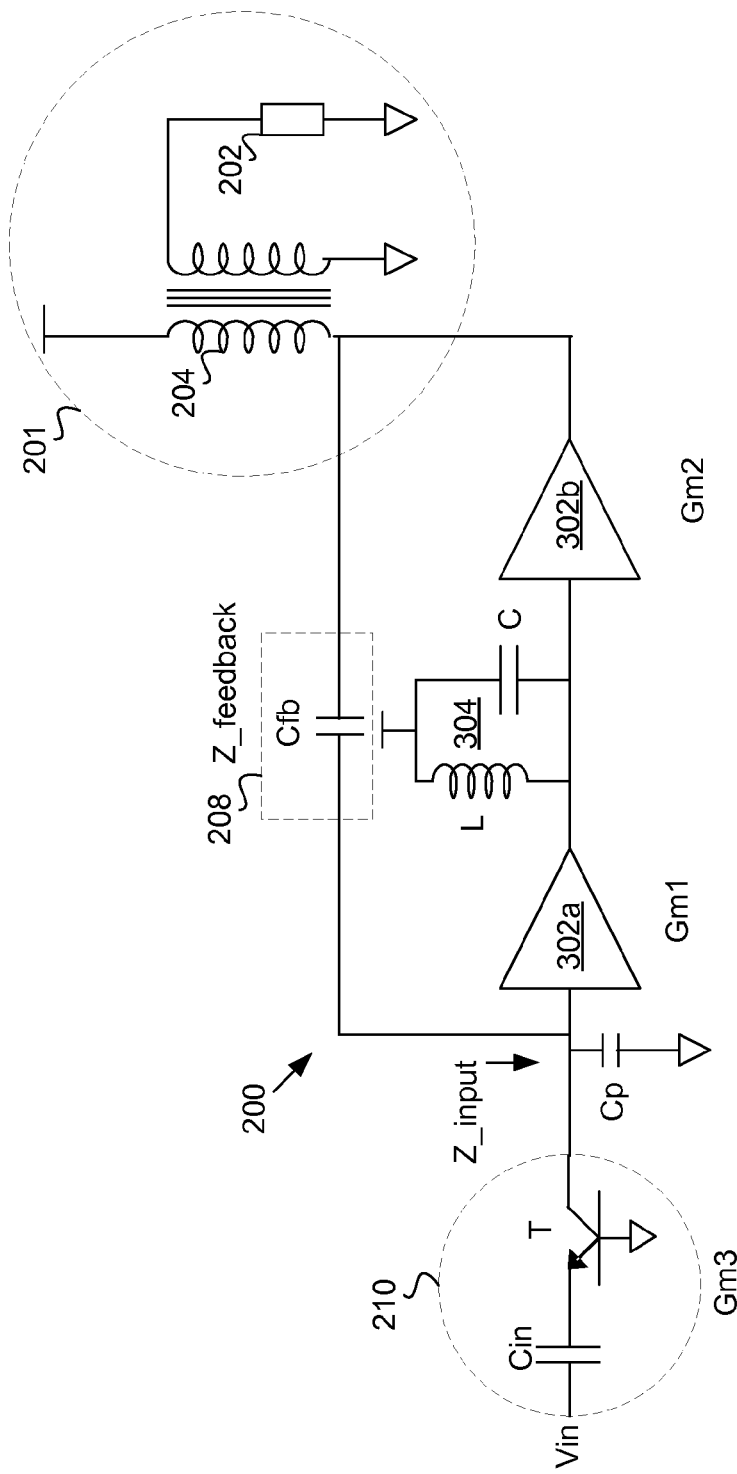
FIG. 3b shows a more detailed example of the current input driver shown in FIG. 3a according to one embodiment.

FIG. 3b shows a more detailed example of the current input driver shown in FIG. 3a according to one embodiment. As shown, input circuit 210 includes a capacitor Cin and a transistor T. In one example, transistor T is a bipolar junction transistor (BJT) but other types of transistors may be used.

The closed loop gain is a function of the transductance Gm3 of transistor T and frequency. Particular embodiments make Gm3 be a function of the capacitance Cin. For example, Gm3 may be Vin/(impedance of Cin). In this case, the closed loop gain may be equal to:

$$ClosedLoopGain = \frac{Cin}{Cfb}.$$

In the above cases, when the capacitance of capacitor Cp changes, the closed loop gain may be affected. A voltage input driver may be used to maximize loop gain.

Figure 4:
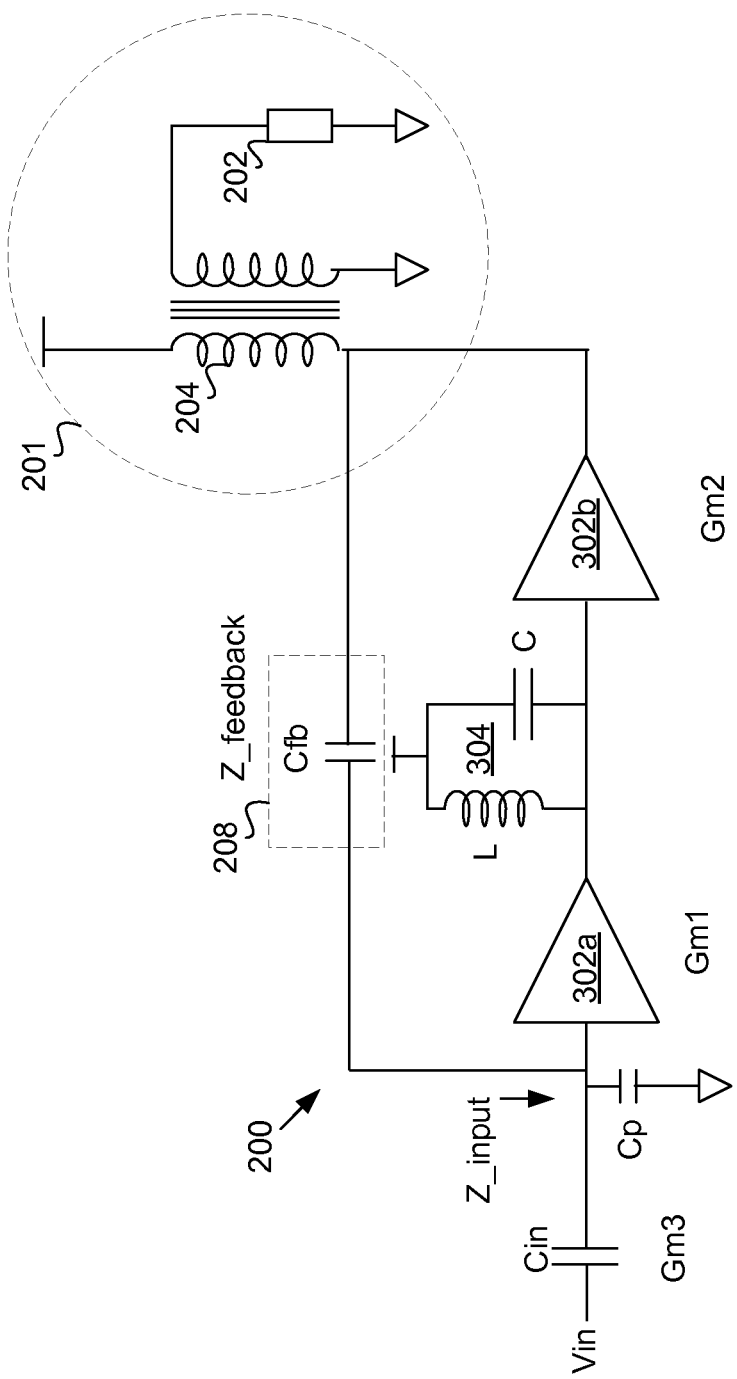
FIG. 4 depicts an example of a power amplifier using a voltage input driver according to one embodiment.

FIG. 4 depicts an example of power amplifier 200 using a voltage input driver according to one embodiment. Input circuit 210 may include a capacitor Cin. In this case, Cp is kept sufficiently small such that capacitor Cin is greater than capacitor Cp (e.g., Cin>>Cp). In this case, the feedback factor β is maximized and a higher loop gain is achieved for the closed loop gain.

The loop gain is:

Loop_Gain=$A(j\omega)*\beta$.

The feedback factor is:

$$\beta = \frac{Cfb}{Cfb + Cp + Cin}.$$

With Cin>>Cp, the closed loop gain may be as follows:

$$ClosedLoopGain = \frac{Cin}{Cfb}.$$

Also, in this case, feedback factor β also does not introduce a phase shift or pole.

Figure 5:
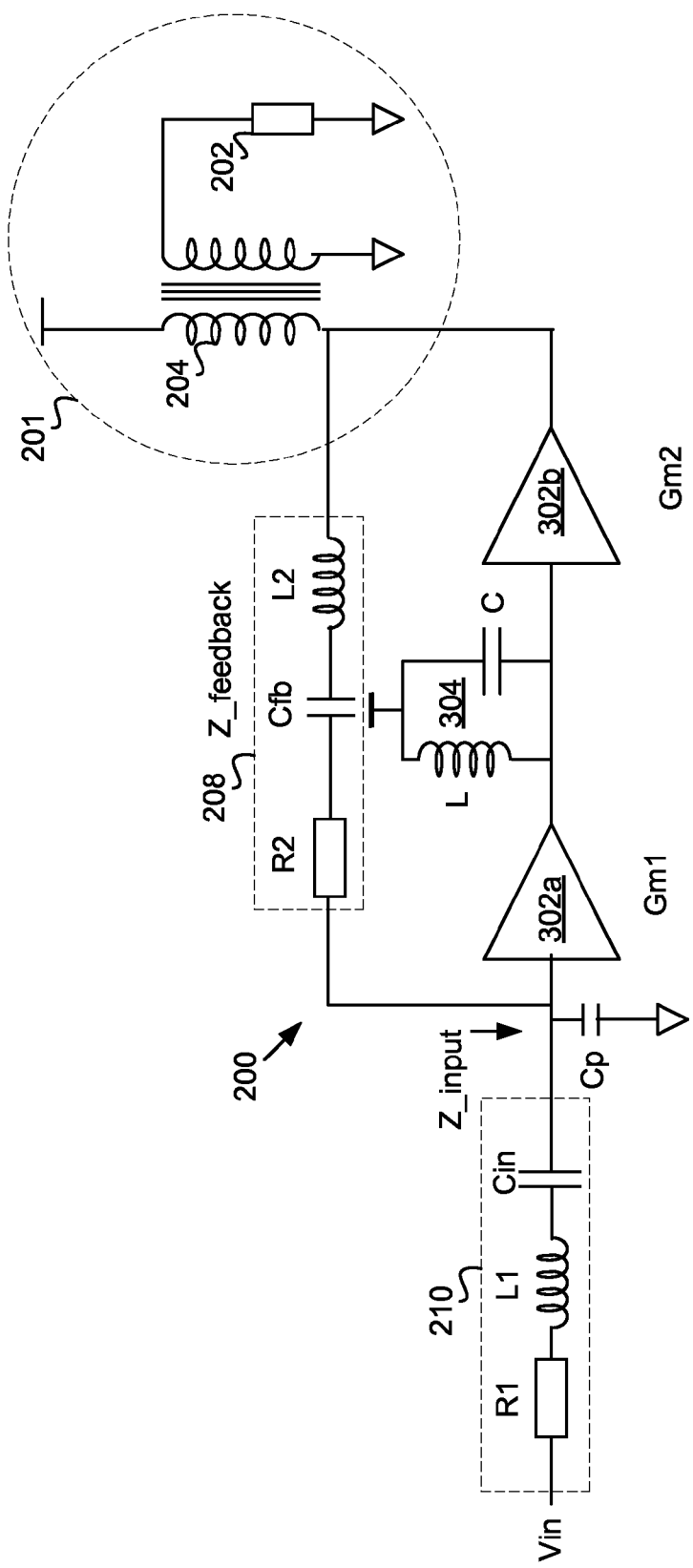
FIG. 5 shows an additional example of the power amplifier using an inductor-capacitor-resistor circuit according to one embodiment.

FIG. 5 shows an additional example of power amplifier 200 using an inductor-capacitor-resistor circuit according to one embodiment. As shown, feedback circuit 208 includes an inductor L2, a capacitor Cfb, and a resistor R2. Input circuit 210 includes a resistor R1, inductor L1, and capacitor Cin.

The loop gain is:

Loop_Gain=$A(j\omega)*\beta$.

The feedback factor is:

$$\beta = \frac{R1}{R1 + R2}.$$

The closed loop gain may be as follows:

$$ClosedLoopGain = \frac{R2}{R1}.$$

The closed loop gain is a factor of resistors R2 and R1. This is because the feedback factor β is not a function of frequency because inductor L and capacitor C cancel each other out if Cp is small. Thus, a closed loop gain is a function of the ratio of resistor R2 to resistor R1. The feedback factor also does not introduce a phase shift or pole.

The linear performance of power amplifier 200 may be about a 27 dB gain using conventional power amplifiers. Particular embodiments may provide a loop gain of 30 dB for a 3 dB improvement due to feedback circuit 208 not adding a pole in the frequency response. The gain is also more linear as changes in gain result in more linear performance changes.

In one example, the following may be used to determine Gm1 and Gm2 for a highest loop gain. Quality factor Q1 is a quality factor of amplifier 302a and resonant tank circuit 304. Quality factor Q2 is a quality factor for amplifier 302b and transformer 204. For amplifier 302a, when the phase shift is the only function of resonant tank circuit 304 Q1, and resonant tank circuit 304 impedance is function of L when quality factor Q1 is fixed. For amplifier 302b, the phase shift is a function of quality factor Q2 of transformer 204 and the impedance is a function of the resistance seen by transformer 204.

Thus, for power amplifier 200 with 60 decibel phase margin, the following is found:

Gm1*Z1(jω,Q1,L)*Gm2*Z2(jω,Q2,6Ω)*β*α=1

PhaseZ1(jω,Q1)+phaseZ2(jω,Q2)=120 dec where Z1 is the impedance of resonant tank 302 and Z2 is the impedance of transformer 204. α is also a variable based a capacitance of resonant tank 302. Also known is:

$$\frac{1}{Gm1*Z1(2\ GHz)*\alpha*Gm2*\beta} << 6.25\Omega$$

This means that the impedance of amplifier 200 less than 6.25Ω. The highest loop gain for 60 phase margin is:

LoopGain=Gm1*Z1(2 GHz,Q1,L)*Gm2*Z2(6.25Ω)
*β*α

The Gm1 and Gm2 are chosen based on above equation. For a certain phase margin, the highest loop gain is function of Q1.

Figure 6:
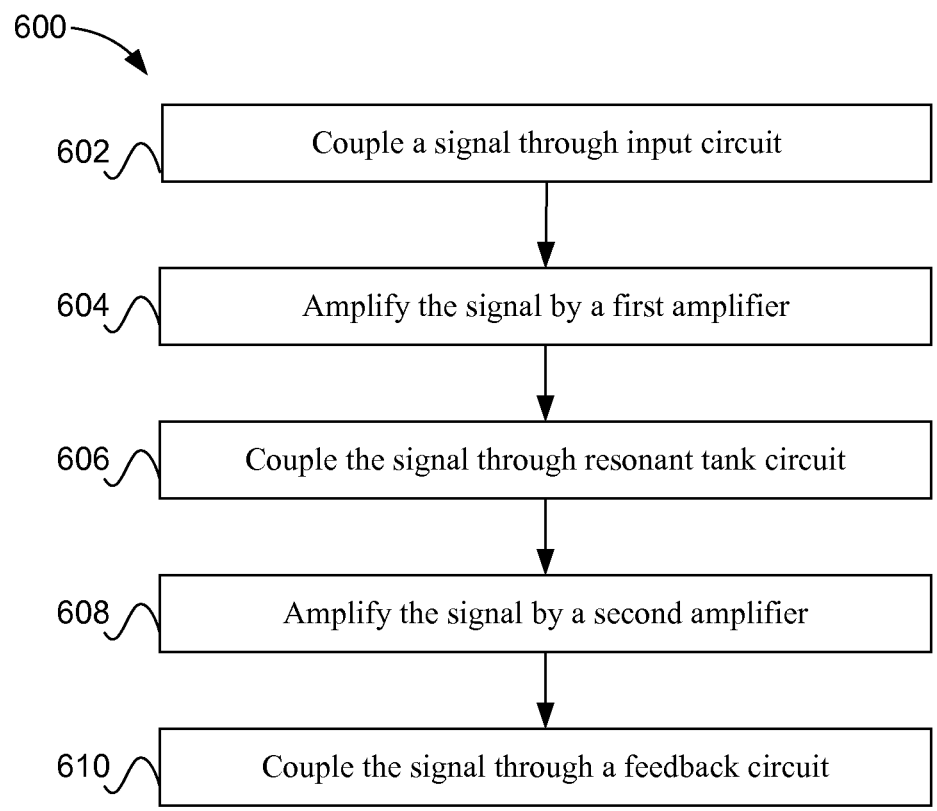
FIG. 6 depicts a simplified flowchart of a method for amplifying a signal according to one embodiment.

FIG. 6 depicts a simplified flowchart 600 of a method for amplifying a signal according to one embodiment. At 602, a signal is coupled through input circuit 210. At 604, the signal is amplified by amplifier 302a. At 606, the signal is coupled through resonant tank circuit 304. Amplifier 302a and resonant tank circuit 304 introduce a phase shift into the signal.

At 608, the signal is amplified by amplifier 302b. At 610, the signal is coupled through transformer 204 for wireless transmission. Amplifier 302a and transformer 204 introduce a second phase shift into the signal.

At 610, the signal is coupled through feedback circuit 208. Feedback circuit 208 includes a capacitor and does not introduce a phase shift into the signal or introduces a phase shift where a total phase shift is less than a threshold for stable operation.

Accordingly, particular embodiments use a capacitor or inductor-capacitor-resistor feedback circuit. This results in a minimal phase shift in feedback circuit 208 and a power amplifier gain output that does not oscillate and is stable. The phase shift of the entire loop is less than 180°, which means power amplifier 200 is stable.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
   an amplifier circuit having a phase shift, wherein the amplifier circuit is configured to amplify a signal for wireless transmission; and
   a feedback circuit coupled to the amplifier circuit, wherein:
   feedback components of the feedback circuit are selected based on a feedback factor that analyzes an input impedance provided by input components to the amplifier circuit and the feedback components of the feedback circuit,
   the feedback components are selected such that the feedback factor indicates the feedback components have a same impedance characteristic as the input impedance of the input components,
   the feedback components are selected such that the feedback factor indicates a total phase shift of the signal, for the amplifier circuit and the feedback circuit, is less than a threshold, and
   the feedback components include a capacitor.

2. The apparatus of claim 1, wherein the capacitor in the feedback circuit does not add a pole in a frequency response for the amplifier circuit.

3. The apparatus of claim 1, wherein the phase shift comprises a first phase shift, wherein a second phase shift introduced by the feedback circuit does not cause the total phase shift of the first phase shift and the second phase shift to exceed the threshold.

4. The apparatus of claim 1, wherein the capacitor in the feedback circuit minimizes a phase shift in the signal.

5. The apparatus of claim 1, wherein the phase shift for the amplifier circuit comprises a first phase shift and a second phase shift, wherein the amplifier circuit comprises:
   a first amplifier stage associated with the first phase shift; and
   a second amplifier stage associated with the second phase shift, wherein the total phase shift of the signal for the first amplifier stage, the second amplifier stage, and the feedback circuit is less than the threshold.

6. The apparatus of claim 5, further comprising:
   a resonant tank circuit; and
   a transformer,
   wherein:
   the first amplifier stage and the resonant tank circuit introduce the first phase shift, and
   the second amplifier stage and the transformer introduce the second phase shift.

7. The apparatus of claim 1, wherein the capacitor comprises a first capacitor, wherein
   the feedback circuit comprises:
   a first resistor,
   a first inductor, and
   the first capacitor,
   an input circuit to the amplifier circuit comprises:
   a second resistor,
   a second inductor, and
   a second capacitor.

8. The apparatus of claim 7, wherein the feedback factor of the feedback circuit is based on the first resistor and the second resistor.

9. The apparatus of claim 1, wherein the input circuit comprises a current divider or voltage divider.

10. The apparatus of claim 1, wherein the capacitor comprises a first capacitor, wherein the input circuit comprises:
    a second capacitor; and
    a transistor.

11. The apparatus of claim 10, wherein the feedback factor of the feedback circuit is based on the first capacitor and the second capacitor.

12. A system comprising:
    a first amplifier stage configured to amplify a signal for wireless transmission;
    a resonant tank circuit configured to receive the signal from the first amplifier stage, wherein the first amplifier stage and the resonant tank circuit introduce a first phase shift in the signal;
    a second amplifier stage configured to amplify the signal from the resonant tank circuit;
    a transformer configured to receive the signal from the second amplifier stage, wherein the second amplifier stage and the transformer introduce a second phase shift in the signal; and
    a feedback circuit coupled to the second amplifier stage, wherein:
    feedback components of the feedback circuit are selected based on a feedback factor that analyzes an input impedance provided by input components to the amplifier circuit and the feedback components of the feedback circuit,
    the feedback components are selected such that the feedback factor indicates the feedback components have a same impedance characteristic as the input impedance of the input components,
    the feedback components are selected such that the feedback factor indicates a total phase shift of the signal transferred through a feedback loop is less than a threshold, the feedback loop including the first amplifier stage, resonant tank circuit, second amplifier stage, and the feedback circuit, and
    the feedback components include a capacitor.

13. A method comprising:
    amplifying a signal for wireless transmission through an amplifier circuit; and
    coupling the signal through a feedback circuit coupled to the amplifier circuit, wherein:

feedback components of the feedback circuit are selected based on a feedback factor that analyzes an input impedance provided by components to the amplifier circuit and the feedback components of the feedback circuit, the feedback components are selected such that the feedback factor indicates the feedback components have a same impedance characteristic as the input impedance of the input components, the feedback components are selected such that the feedback factor indicates a total phase shift of the signal, for the amplifier circuit and the feedback circuit, is less than a threshold, and the feedback components include a capacitor.

14. The method of claim 13, wherein the capacitor in the feedback circuit does not add a pole in a frequency response for the amplifier circuit.

15. The method of claim 14, wherein the capacitor in the feedback circuit minimizes a phase shift in the signal.

16. The method of claim 13, wherein the amplifier circuit comprises a first amplifier stage and a second amplifier stage, the method further comprising:
coupling the signal through the first amplifier stage;
coupling the signal through a resonant tank circuit;
coupling the signal through the second amplifier stage; and
coupling the signal through a transformer.

17. The method of claim 16, wherein:
the first amplifier stage and the resonant tank circuit introduce a first phase shift, and
the second amplifier stage and the transformer introduce a second phase shift.

18. The method of claim 13, wherein the capacitor comprises a second capacitor, the method further comprising:
coupling the signal through a first capacitor, a first resistor, and a first inductor to input the signal to the amplifier circuit,
wherein coupling the signal through the feedback circuit comprises coupling the signal through a second inductor, the second capacitor, and a second resistor.

19. The method of claim 18, wherein the feedback factor of the feedback circuit is based on the first resistor and the second resistor.

20. The method of claim 13, wherein the capacitor comprises a first capacitor, wherein the input circuit comprises:
a second capacitor; and
a transistor, wherein the feedback factor of the feedback circuit is based on the first capacitor and the second capacitor.

* * * * *